United States Patent
Nobuyuki et al.

(10) Patent No.: US 6,579,112 B1
(45) Date of Patent: Jun. 17, 2003

(54) ZIF SOCKET WITH IMPROVED CAM MECHANISM

(75) Inventors: Hasegawa Nobuyuki, Tu-Chen (TW); Nick Lin, Tu-Chen (TW); Fang-Jwu Liao, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/108,124

(22) Filed: Mar. 27, 2002

(51) Int. Cl.[7] .............................................. H01R 13/625
(52) U.S. Cl. ....................................................... 439/342
(58) Field of Search ........................... 439/342, 259–270

(56) References Cited

U.S. PATENT DOCUMENTS 6,116,936 A * 9/2000 Pei .............................. 439/342
6,203,350 B1 * 3/2001 Walkup et al. ............... 439/342
6,247,953 B1 * 6/2001 Walkup et al. ............... 439/342
6,280,224 B1 * 8/2001 Huang .......................... 439/342
6,296,506 B1 * 10/2001 Mizumura et al. .......... 439/342
6,296,507 B1 * 10/2001 Huang ......................... 439/342
6,340,309 B1 * 1/2002 Lin et al. ..................... 439/342

* cited by examiner

Primary Examiner—Gary Paumen
(74) Attorney, Agent, or Firm—Wei Te Chung

(57) ABSTRACT

A ZIF socket (1) includes a base (2), a cover (3) movably mounted on the base, a plurality of contacts received in the base, and a cam mechanism (4) engaged with the cover and the base. The cam mechanism comprises a cam device (41) and a base ring (42) assembled on the cam device. The cam device is composed of five column-shaped portions, the diameters of which are successively decreasing from the uppermost one to the lowermost one. A topside of the base ring abuts directly against a supporting surface (417) formed on the cam device to reduce the frictional force required to overcome during rotating the cam mechanism.

1 Claim, 6 Drawing Sheets

ZIF SOCKET WITH IMPROVED CAM MECHANISM

BACKGROUND OF THE INVENTION

1. Field of the Invention

The present invention relates to a Zero Insertion Force (ZIF) socket, and particularly to a ZIF socket having an improved cam mechanism for driving a cover to slide on a base of the ZIF socket.

2. Description of Prior Art

ZIF sockets are known in the art for connecting Integrated Circuit (IC) packages to printed circuit boards. Referring to FIGS. 6 and 7, a conventional ZIF socket 6 usually employs a cam mechanism 9 to drive a cover 8 to slide on a base 7 in a front-to-back direction. The cam mechanism 9 comprises a base ring 92 and a cam device 91 which is composed of four column-shaped portions. A riveting portion 93 is formed at a bottom end of the cam device 91 for being riveted on the base ring 92, thereby securing the cam device 91 in the cover 8 and the base 7. However, because the base ring 92 directly abuts against a bottom face 71 of the base 7, the necessary force exerted on the cam mechanism 9 for driving the cam device 91 to rotate in a corresponding hole of the base 7 is greatly increased.

Hence, a ZIF socket having an improved cam mechanism is required to overcome the disadvantages of the prior art.

BRIEF SUMMARY OF THE INVENTION

The object of the present invention is to provide a ZIF socket with a cam mechanism which has five column-shaped portions and forms a supporting surface therewith for reducing a torque to be exerted on the cam mechanism.

In order to achieve the above-mentioned object, a ZIF socket in accordance with the present invention includes a dielectric base, a cover slidably mounted on the base, a plurality of contacts received in the base, and a cam mechanism engaged with the cover and the base. The cam mechanism comprises a cam device and a base ring attached to the cam device from a bottom side thereof. The cam device is composed of five column-shaped portions, the diameters of which are degressive from the uppermost one to the lowermost one. A first driving portion and a second driving portion of the cam device are received in corresponding first and second holes of the cover. A first rotating portion extending straightly and downwardly from the second driving portion and a second rotating portion are both retained in an elliptic hole defined in the base. A riveting portion projects downwardly from the second rotating portion and engages with the base ring and is then subject to a riveting operation. A topside of the base ring abuts directly against a supporting surface formed on a lower end of the second rotating portion of the cam device instead of abutting against a bottom face of the conventional ZIF socket thus to reduce the torsion force required to rotate the cam mechanism.

Other objects, advantages and novel features of the invention will become more apparent from the following detailed description of the present embodiment when taken in conjunction with the accompanying drawings.

DETAILED DESCRIPTION OF THE INVENTION

Figure 1:
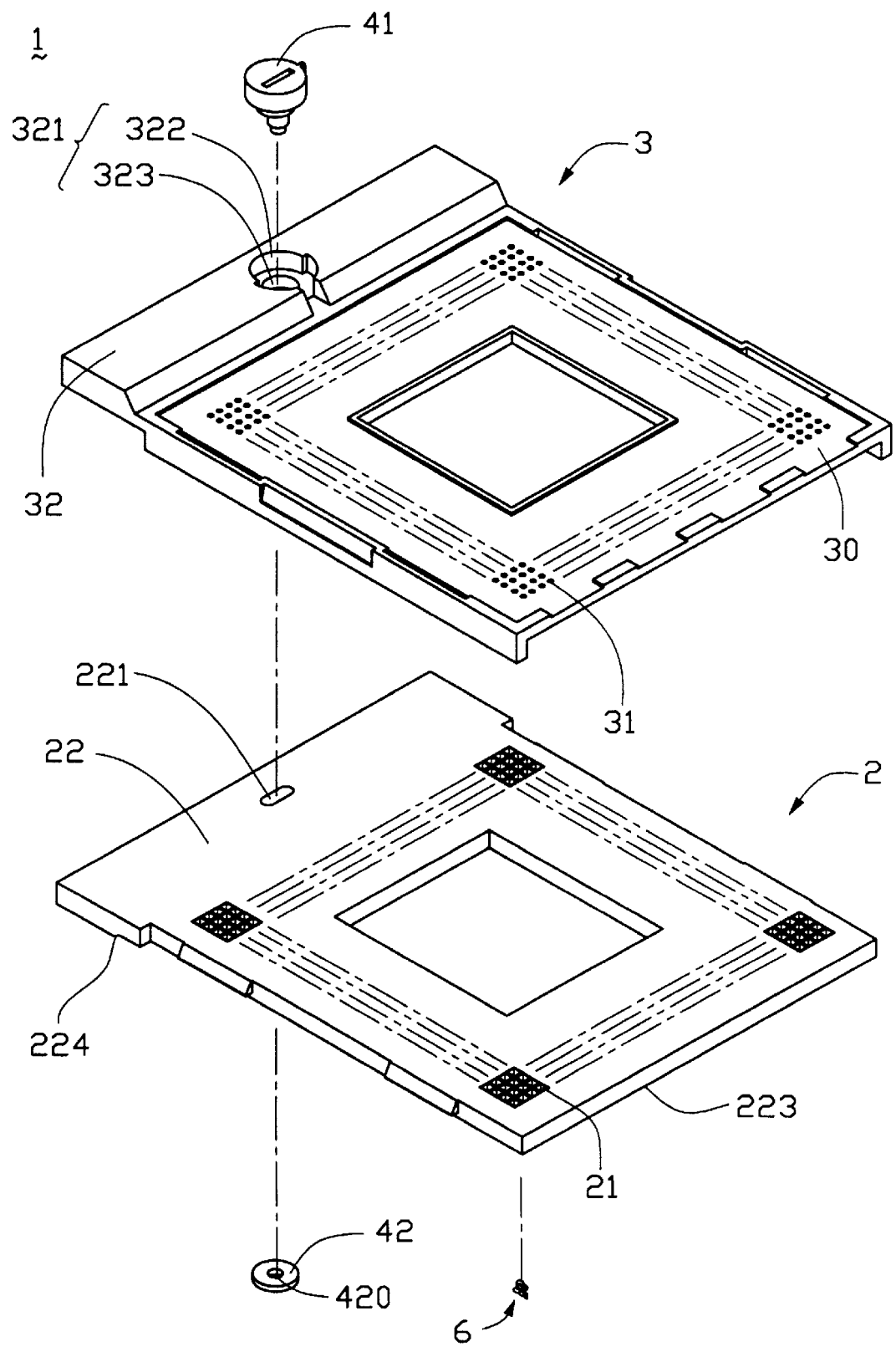
FIG. 1 is an exploded, perspective view of a ZIF socket in accordance with the present invention.

Reference will now be made to the drawing figures to describe the present invention in detail.

Figure 2:
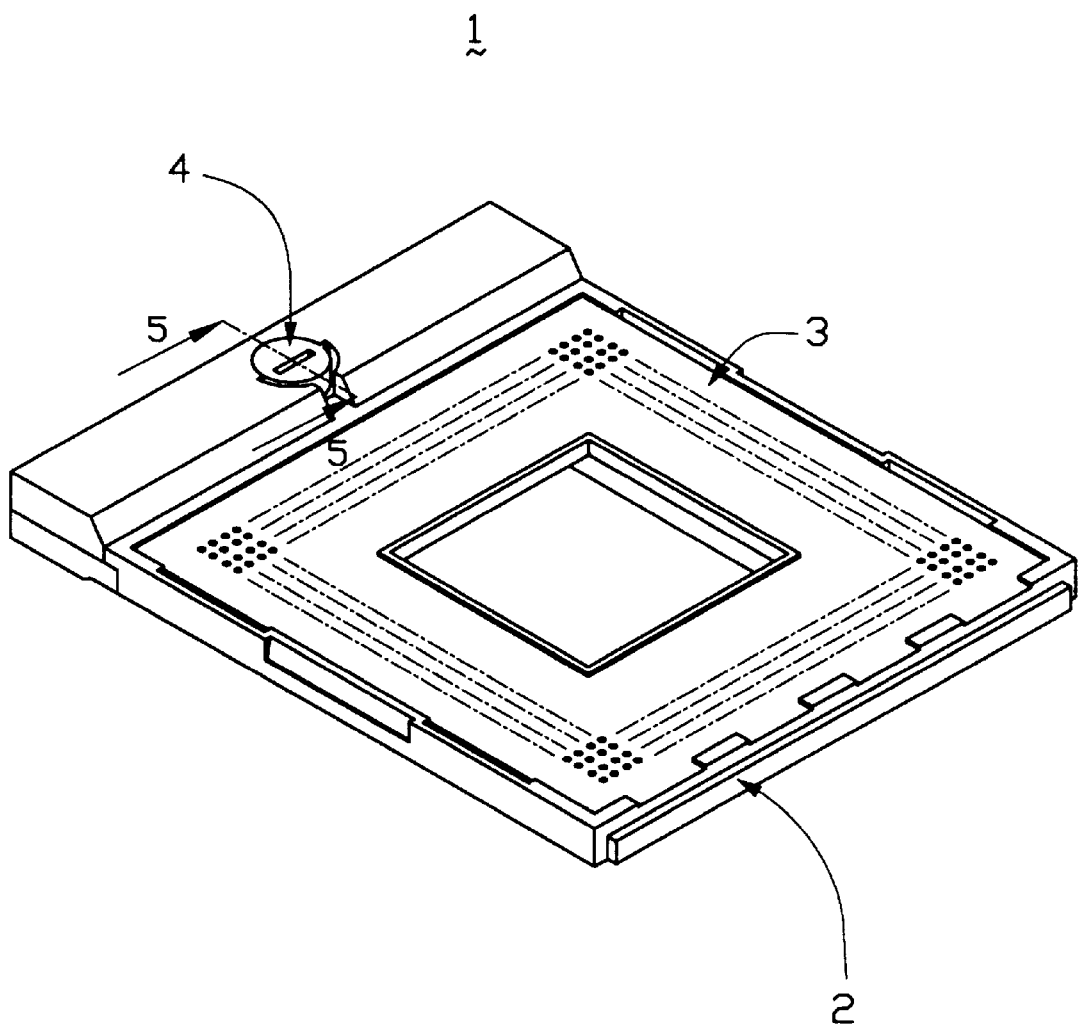
FIG. 2 is an assembled, perspective view of the ZIF socket shown in FIG. 1.

Referring to FIGS. 1 and 2, a ZIF socket 1 in accordance with the present invention is used in a known way to connect an IC package (not shown) to a printed circuit board (not shown) on which the ZIF socket 1 is mounted. The. ZIF socket 1 comprises a dielectric base 2, a cover 3 slidably mounted on the dielectric base 2, a plurality of contacts 6 (not shown) received in the dielectric base 2 for electrically connecting corresponding pins of the IC package with the printed circuit board, and a cam mechanism 4 assembled to and fastening together both the dielectric base 2 and the cover 3.

The dielectric base 2 is configured as a rectangular shape and defines an elliptic hole 221 at a front end 224 thereof and a plurality of contact receiving passageways 21 through a top face 22 and a bottom face 223 for accommodating corresponding contacts therein.

The cover 3 is movable on the dielectric base 2 and comprises a main body 30 and a head section 32 extending forwardly from a front end of the main body 30. A plurality of through-holes 31 are defined through the main body 30 of the cover 3 and in alignment with corresponding contact receiving passageways 21 for extension of the pins of the IC package therethrough into the contact receiving passageways 21. The head section 32 defines a receiving hole 321 in a middle thereof comprising a first hole 322 and a second hole 323 to receive corresponding parts of the cam mechanism 4, which will be described in great detail hereinafter.

Figure 3:
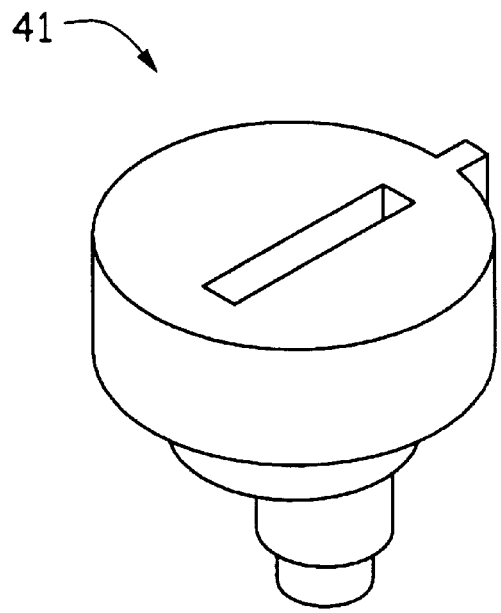
FIG. 3 is a perspective view of a cam mechanism of the ZIF socket shown in FIG. 1.
Figure 4:
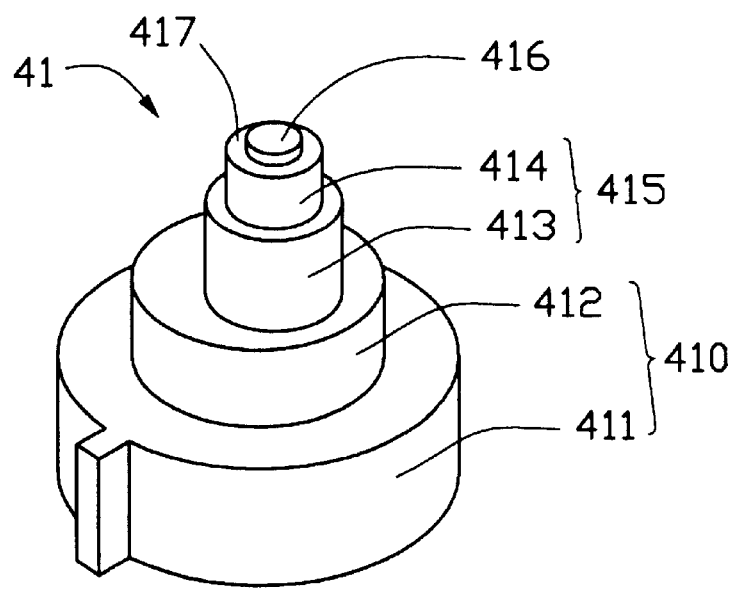
FIG. 4 is an upside-down, perspective view of the cam mechanism shown in FIG. 3.

The cam mechanism 4 comprises a cam device 41 which is designed in a turbinate shape, and a base ring 42 which is made of metal material in a preferred embodiment of the present invention and assembled to the cam device 41 from a bottom side thereof. Particularly referring to FIGS. 3 and 4, the cam device 41 includes a driving section 410 received in the receiving hole 321 of the cover 3, a rotating section 415 extending straightly from the driving section 410 and received in the elliptic hole 221 of the dielectric base 2, and a riveting portion 416, diameters of which are different from each other. The rotating section 415 has a supporting surface 417 at a lower end thereof and the riveting portion 416 projects downwards from the supporting surface 417. The axes of the driving section 410 and the rotating section 415 are offset from each other a predetermined distance. The base ring 42 is configured as a substantial annular plate with a hole 420 defined therein and the riveting portion 416 is received in the hole 420 of the base ring 42 and riveted on a bottom side thereof.

The driving section 410 comprises a first driving portion 411 and a second driving portion 412 coaxially projecting from the first driving portion 411, the diameter of which is smaller than that of the first driving portion 411. The first driving portion 411 and the second driving portion 412 are respectively received in the first and second holes 322, 323 of the receiving hole 321 of the cover 3. The rotating section 415 comprises a first rotating portion 413 and a second rotating portion 414 coaxially projecting from the first rotating portion 413, the diameter of which is smaller than that of the first rotating portion 413. Both the first rotating portion 413 and the second rotating portion 414 are received in the elliptic hole 221 defined in the base 2.

Figure 5:
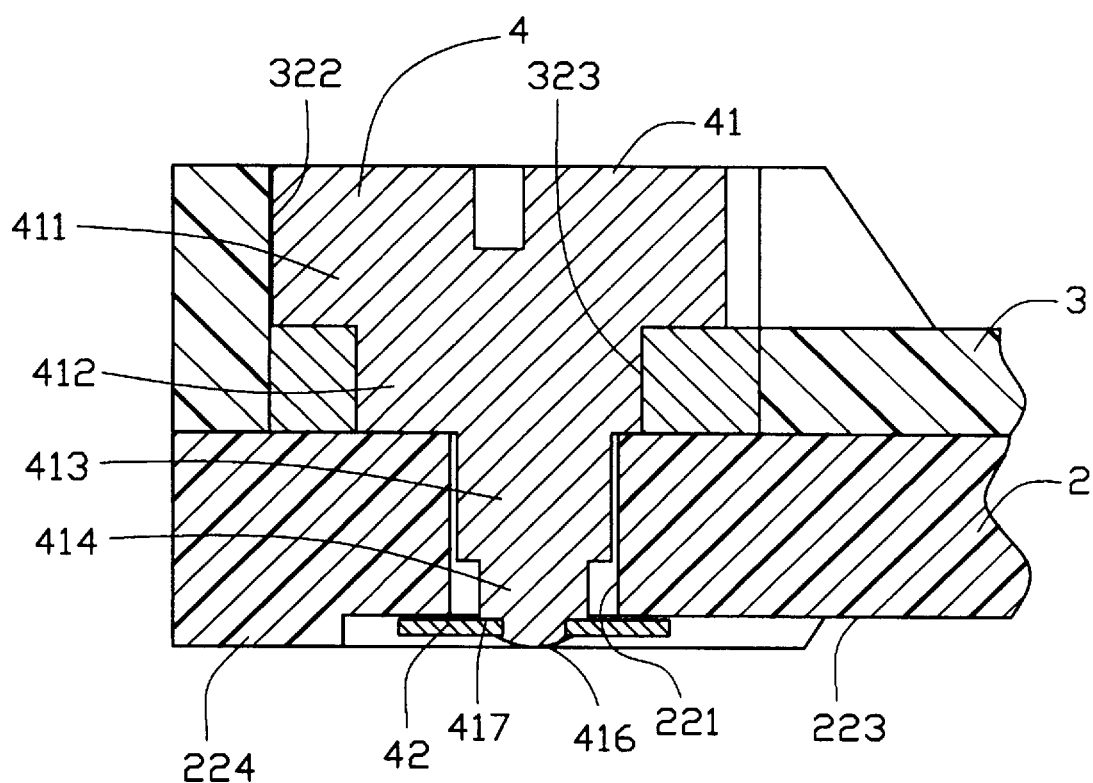
FIG. 5 is a cross-sectional view of the ZIF socket taken along line 5—5 of FIG. 2.
Figure 6:
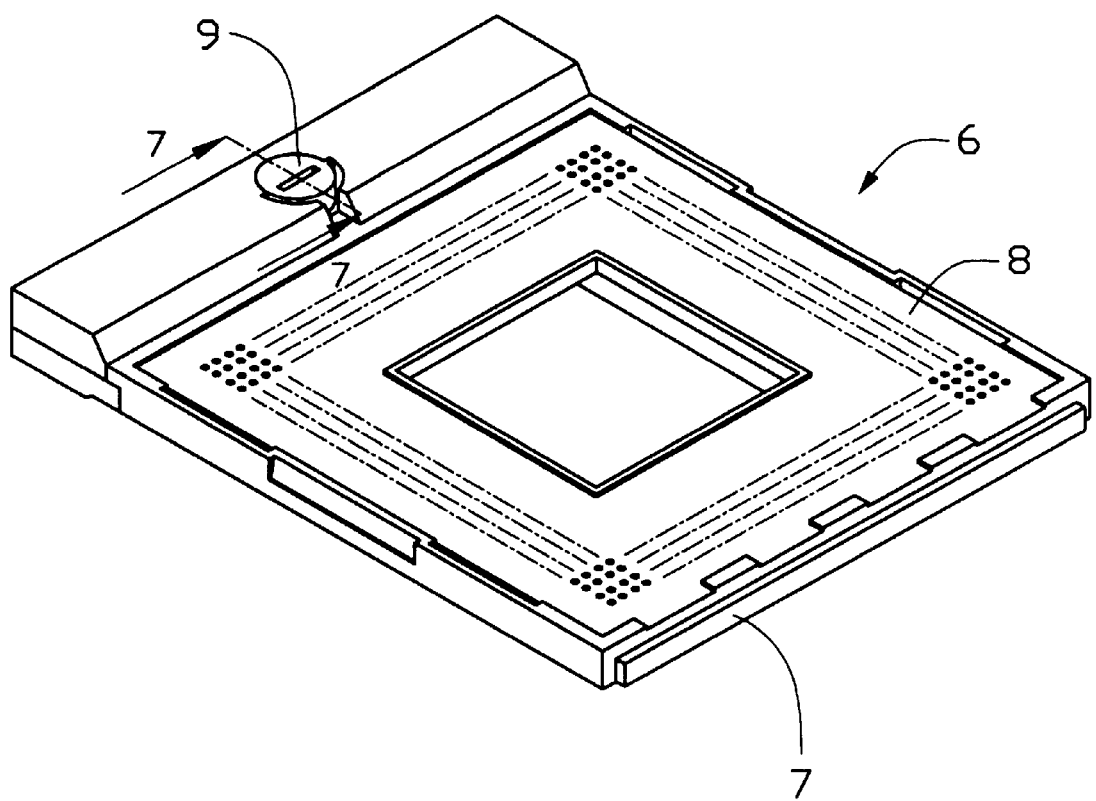
FIG. 6 is an assembled, perspective view of a conventional ZIF socket.
Figure 7:
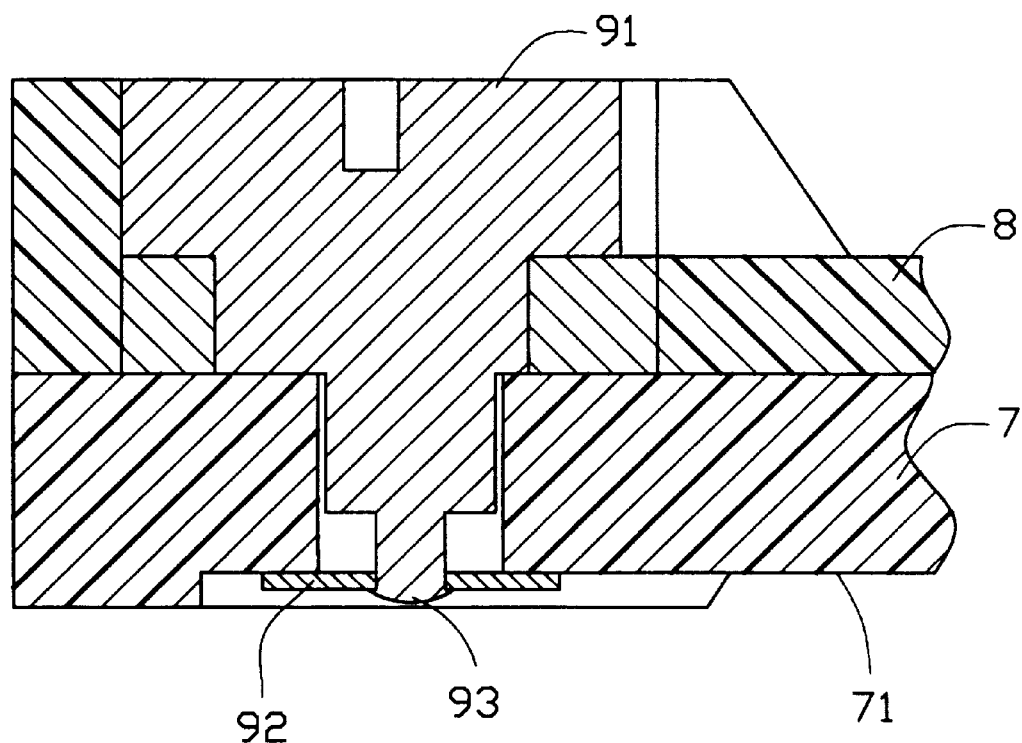
FIG. 7 is a cross-sectional view of the conventional ZIF socket taken along line 7—7 of FIG. 6.

In assembly, referring to FIG. 5, the cover 3 is first assembled on the dielectric base 2. The through-holes 31 of the cover 3 are aligned with the contact receiving passageways 21 of the dielectric base 2 and the receiving hole 321 is lined up with the elliptic hole 221. The cam device 41 of the cam mechanism 4 is attached to the cover 3 and the base 2 with the driving section 410 being received in the receiving hole 321 and with the rotating section 415 being contained in the elliptic hole 221. A lower end of the second rotating portion 414 of the rotating section 415 extends through the elliptic hole 221 of the dielectric base 2 with the supporting surface 417 thereof being disposed appreciably beyond the bottom face 223 of the base 2. The riveting portion 416 engages with the hole 420 of the base ring 42 and then is riveted on the bottom side of the base ring 42. A topside of the base ring 42 abuts against the supporting surface 417 of the second rotating portion 414 and the supporting surface 417 spaces a small distance from the bottom face 223 to avoid a larger torsion force exerted on the cam mechanism 4.

Compared with the prior art, a torsion force exerted on the cam mechanism 4 of the present invention to drive the cam device 41 to rotate in the receiving hole 321 is greatly reduced due to the base ring 42 abutting against the supporting surface 417 of the cam device 41 instead of abutting against the bottom face 223 of the base 2 which would result in high friction force.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A ZIF (Zero Insertion Force) socket comprising:

- a dielectric base having a top face, a bottom face and a plurality of contact receiving passageways defined through said top face and said bottom face;
- a cover movably mounted on said dielectric base;
- a plurality of contacts received in the plurality of contact receiving passageways of said dielectric base; and
- a cam mechanism engaged with said cover and said dielectric base for driving said cover to slide on said dielectric base, said cam mechanism comprising a cam device and a base ring assembled on said cam device, said cam device having a driving section received in said cover, a rotating section extending downwardly from said driving section and received in said base, and a riveting portion projecting downwardly from a lower end of said rotating section beyond the bottom face of said base, said rotating section having an axis offset from that of said driving section a predetermined distance;
- wherein said rotating section of said cam device defines a supporting surface at said lower end, said supporting surface being disposed beyond said bottom face of said dielectric base and spacing therefrom a small distance, said base ring is assembled on said supporting surface and said riveting section of said cam device is riveted on said base ring;
- wherein said driving section, said rotating section and said riveting section of said cam device are configured in cylindrical shapes with decreasing diameters;
- wherein said driving section of said cam device comprises a first driving portion and a second driving portion coaxially extending downwardly from said first driving portion and having a smaller diameter than that of said first driving portion, and said cover defines a receiving hole at a front end thereof having a first hole rotatably receiving said first driving portion and a second hole rotatably receiving said second driving portion;
- wherein said rotating section of said cam device comprises a first rotating portion and a second rotating portion coaxially extending downwardly from said first rotating portion and having a smaller diameter than that of said first rotating portion, and said dielectric base defines an elongate hole at a front end thereof rotatably receiving said rotating section therein;
- wherein said base ring is configured as an annular plate and defines a hole therein engaged with said riveting section of said cam device.

* * * * *